(12) United States Patent
Sano et al.

(10) Patent No.: US 12,112,881 B2
(45) Date of Patent: *Oct. 8, 2024

(54) INDUCTOR COMPONENT AND INDUCTOR COMPONENT MOUNTING SUBSTRATE

(71) Applicant: Murata Manufacturing Co., Ltd., Kyoto-fu (JP)

(72) Inventors: Rikiya Sano, Nagaokakyo (JP); Masayuki Yoneda, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/523,280

(22) Filed: Nov. 29, 2023

(65) Prior Publication Data

US 2024/0096545 A1 Mar. 21, 2024

Related U.S. Application Data

(63) Continuation of application No. 17/511,367, filed on Oct. 26, 2021, now Pat. No. 11,869,688.

(30) Foreign Application Priority Data

Oct. 28, 2020 (JP) ................................ 2020-180534

(51) Int. Cl.
*H01F 27/29* (2006.01)
*H01F 27/28* (2006.01)
*H05K 1/18* (2006.01)

(52) U.S. Cl.
CPC ............. *H01F 27/292* (2013.01); *H05K 1/18* (2013.01); *H01F 27/2804* (2013.01);
(Continued)

(58) Field of Classification Search
CPC .. H05K 1/111; H05K 1/18; H05K 2201/0376; H05K 2201/09381;
(Continued)

(56) References Cited

U.S. PATENT DOCUMENTS 6,280,858 B1 * 8/2001 Teshima ............... H05K 3/3463
428/646
6,774,196 B1 * 8/2004 Taira ................... C08F 214/262
525/200

(Continued)

FOREIGN PATENT DOCUMENTS

| JP | 2003-031424 A | 1/2003 |
| JP | 2007-188957 A | 7/2007 |
| WO | 2015/115180 A1 | 8/2015 |

*Primary Examiner* — William H. Mayo, III
*Assistant Examiner* — Rhadames Alonzo Miller
(74) *Attorney, Agent, or Firm* — Studebaker & Brackett PC

(57) ABSTRACT

An inductor component includes a component body having a mounting surface and a top surface and provided therein with a spiral inductor wiring line advancing in the extending direction of a winding center axis. The inductor wiring line is connected to a first external electrode at a first end, and connected to a second external electrode at a second end. The component body includes: a first inclined surface connected to a first end of the mounting surface on a first side in a length direction and inclined toward the top surface as separating from the first end; and a second inclined surface connected to a second end of the mounting surface on a second side in the length direction and inclined toward the top surface as separating from the second end. The winding center axis extends in a direction parallel to the mounting surface and perpendicular to the length direction.

7 Claims, 3 Drawing Sheets

(52) U.S. Cl.
CPC ............ *H05K 2201/09381* (2013.01); *H05K 2201/09472* (2013.01); *H05K 2201/1003* (2013.01)

(58) Field of Classification Search
CPC . H05K 2201/09472; H05K 2201/1003; H05K 3/3442; H01F 17/0013; H01F 27/2804; H01F 27/292
See application file for complete search history.

(56) References Cited

U.S. PATENT DOCUMENTS

| | | | | |
|---|---|---|---|---|
| 2002/0017018 A1* | 2/2002 | Ohkawara | ............... | B82Y 10/00 29/603.18 |
| 2002/0177667 A1* | 11/2002 | Apostolo | ................. | C08F 8/22 522/113 |
| 2003/0137053 A1* | 7/2003 | Okayama | .......... | H01L 21/76877 257/E21.585 |
| 2003/0222335 A1* | 12/2003 | Hirano | ................. | H05K 3/3442 257/E29.022 |
| 2004/0219341 A1* | 11/2004 | Kataoka | ................ | H05K 3/388 428/209 |
| 2004/0236047 A1* | 11/2004 | Ono | ...................... | C08F 259/08 526/250 |
| 2007/0149734 A1* | 6/2007 | Sakakibara | ............. | C08F 14/18 174/111 |
| 2008/0281067 A1* | 11/2008 | Nanba | ..................... | C08F 14/26 526/255 |
| 2013/0256848 A1* | 10/2013 | Kawabata | ........... | H01L 23/3135 257/659 |
| 2014/0145816 A1* | 5/2014 | Sato | .................... | H01F 17/0013 336/208 |
| 2015/0084729 A1* | 3/2015 | Lee | ..................... | H01F 17/0013 336/192 |
| 2015/0145627 A1* | 5/2015 | Sim | .................... | H01F 17/0013 336/105 |
| 2016/0035476 A1* | 2/2016 | Mimura | ................ | H01F 41/046 336/199 |
| 2017/0098997 A1* | 4/2017 | Hamada | ................ | G06F 1/1635 |
| 2017/0345552 A1* | 11/2017 | Nakano | ................ | H01F 41/043 |
| 2018/0075965 A1* | 3/2018 | Yoshioka | ........... | H01F 27/2823 |
| 2018/0240591 A1* | 8/2018 | Ishima | ................ | H01F 17/0013 |
| 2018/0294090 A1* | 10/2018 | Nishikawa | .......... | H01F 17/0033 |
| 2019/0051450 A1* | 2/2019 | Shimoda | ........... | H01F 27/323 |
| 2019/0088403 A1* | 3/2019 | Ito | ........................ | H01F 41/041 |
| 2019/0348215 A1* | 11/2019 | Koike | .................. | H01F 27/292 |
| 2019/0362887 A1* | 11/2019 | Yang | .................... | H01F 27/292 |
| 2020/0013540 A1* | 1/2020 | Kang | .................... | H01F 27/292 |
| 2020/0013544 A1* | 1/2020 | Yoshioka | ........... | H01F 27/2828 |
| 2020/0027645 A1* | 1/2020 | Yoshioka | ........... | H01F 27/323 |
| 2020/0082975 A1* | 3/2020 | Yang | .................... | H01F 17/0013 |
| 2020/0118750 A1* | 4/2020 | Sugita | ..................... | B41N 1/06 |
| 2020/0335250 A1* | 10/2020 | Sukegawa | ............ | H01F 17/045 |
| 2020/0335261 A1* | 10/2020 | Sukegawa | ........... | H01F 41/0246 |
| 2020/0335266 A1* | 10/2020 | Maki | .................... | H01F 27/292 |
| 2020/0373079 A1* | 11/2020 | Yoshioka | ........... | H01F 27/327 |
| 2021/0234415 A1* | 7/2021 | Taniguchi | ........... | H02K 1/2791 |

\* cited by examiner

INDUCTOR COMPONENT AND INDUCTOR COMPONENT MOUNTING SUBSTRATE

CROSS-REFERENCE TO RELATED APPLICATION

This application is a Continuation of U.S. patent application Ser. No. 17/511,367 filed Oct. 26, 2021, which claims benefit of priority to Japanese Patent Application No. 2020-180534, filed Oct. 28, 2020, the entire content of which is incorporated herein by reference.

BACKGROUND

Technical Field

The present disclosure relates to an inductor component and an inductor component mounting substrate.

Background Art

A component body of an inductor component described in Japanese Patent Application Laid-Open No. 2007-188957 includes a mounting surface and a top surface facing the mounting surface. In a view from a direction perpendicular to the mounting surface, a length of each side of the top surface is larger than a length of each side of the mounting surface. In addition, the top surface and the mounting surface are connected by inclined surfaces inclined with respect to the mounting surface. That is, the component body has an inverted quadrangular frustum shape expanding from the mounting surface to the top surface.

An inductor wiring line is spirally wound inside the component body. A first end of the inductor wiring line is connected to a first external electrode. The first external electrode extends from the mounting surface to the inclined surface of the component body. A second end of the inductor wiring line is connected to a second external electrode. The second external electrode extends from the mounting surface to the inclined surface opposite to the first external electrode. The winding center axis of a coil around which the inductor wiring line is wound is perpendicular to the mounting surface.

SUMMARY

Because the component body of the inductor component described in Japanese Patent Application Laid-Open No. 2007-188957 has an inverted quadrangular frustum shape expanding from the mounting surface to the top surface, the component body has a larger volume than a rectangular parallelepiped component body having the same area of the mounting surface. Using this fact that the volume is large, it is conceivable to increase an inner diameter of the inductor wiring line in the component body.

Note that in the inductor component described in Japanese Patent Application Laid-Open No. 2007-188957, because the winding center axis of the inductor wiring line extends in the direction perpendicular to the mounting surface, a direction of magnetic flux generated by current flowing through the inductor wiring line also becomes the direction perpendicular to the mounting surface. Therefore, in the inductor component described in Japanese Patent Application Laid-Open No. 2007-188957, regardless of the inner diameter of the inductor wiring line being increased, the magnetic flux is blocked by the external electrodes extending from the mounting surface to the inclined surface, and there is a possibility that expected characteristics cannot be obtained.

Accordingly, one aspect of the present disclosure is an inductor component including a component body having a mounting surface and a top surface facing the mounting surface; an inductor wiring line having a spiral shape, provided in the component body, and advancing in an extending direction of a winding center axis; a first external electrode connected to a first end of the inductor wiring line and exposed to the mounting surface; and a second external electrode connected to a second end of the inductor wiring line and exposed to the mounting surface, in which the first external electrode is arranged on a first side in a first direction parallel to the mounting surface, the second external electrode is arranged on a second side opposite to the first side with respect to the first external electrode in the first direction. The component body includes a first inclined surface connected to a first end of the mounting surface on the first side in the first direction and inclined toward a side of the top surface as being separated from the first end; and a second inclined surface connected to a second end of the mounting surface on the second side in the first direction and inclined toward the side of the top surface as being separated from the second end, and the winding center axis of the inductor wiring line extends in a direction parallel to the mounting surface and perpendicular to the first direction.

In the above configuration, the winding center axis of the inductor wiring line extends in the direction parallel to the mounting surface and perpendicular to the first direction. Therefore, the direction of the magnetic flux generated by the current flowing through the inductor wiring line is also parallel to the mounting surface and perpendicular to the first direction. In this direction of the magnetic flux, regardless of the inner diameter of the inductor wiring line being increased, the magnetic flux will not be easily blocked by the first external electrode or the second external electrode due to the increase in the inner diameter.

It is possible of suppress the magnetic flux from being easily blocked by the first external electrode or the second external electrode.

DETAILED DESCRIPTION

Figure 1:
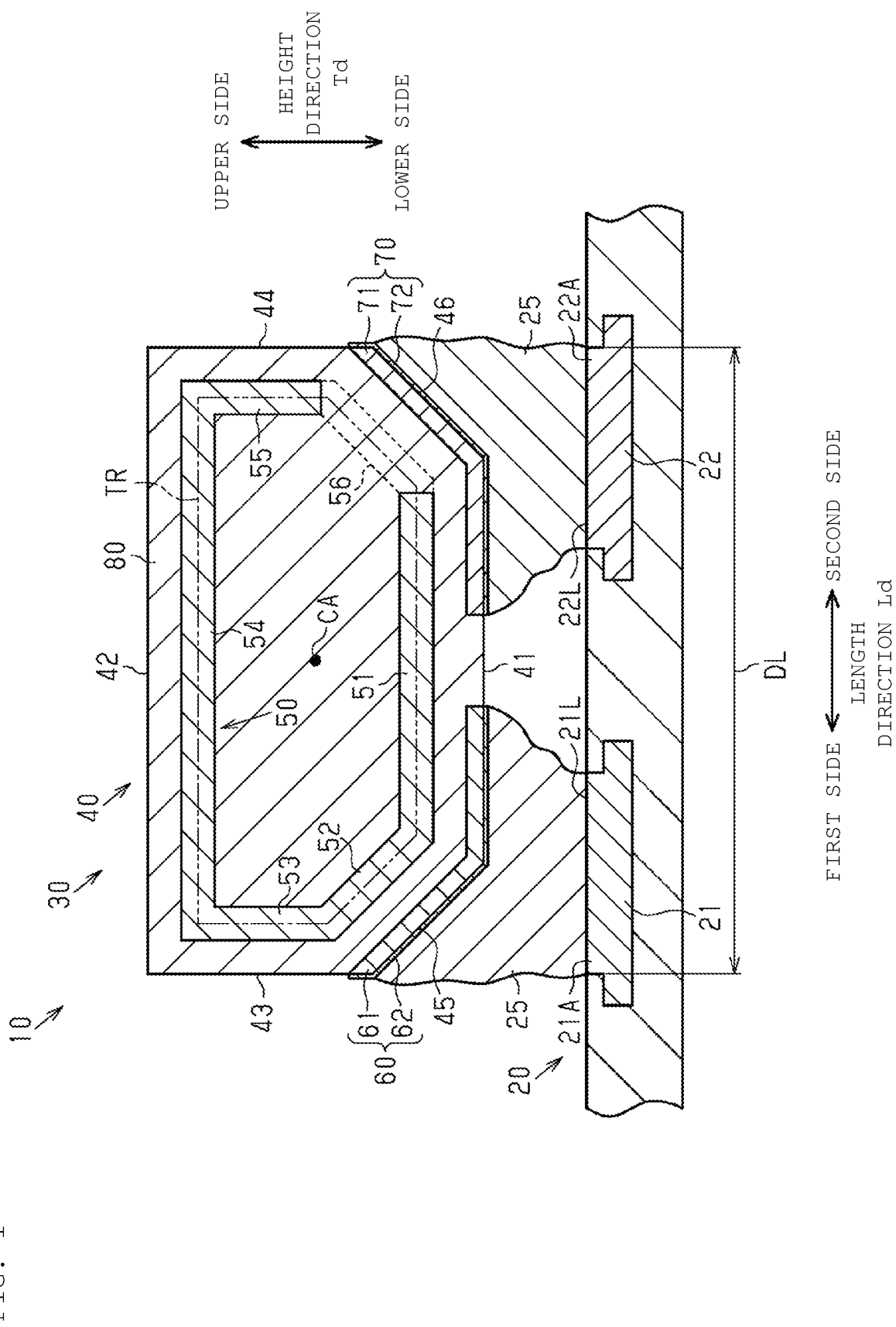
FIG. 1 is a sectional view illustrating an inductor component mounting substrate.

Hereinafter, an embodiment of an inductor component mounting substrate on which an inductor component is mounted is described. Note that, in the drawings, components may be illustrated in an enlarged manner for easy understanding.

The dimensional ratios of the components may be different from the actual ones or those in another drawing.

As illustrated in FIG. 1, an inductor component mounting substrate 10 includes a substrate 20 and an inductor component 30.

The substrate 20 has a plate shape. The substrate 20 has a first wiring line 21 arranged therein. A terminal part 21A of the first wiring line 21 is exposed on a first surface of the substrate 20 on one side in the thickness direction. A portion of the terminal part 21A exposed to the first surface of the substrate 20 is a first land 21L. In addition, the substrate 20 has the second wiring line 22 arranged therein. A terminal part 22A of the second wiring line 22 is exposed on the first surface of the substrate 20. A portion of the terminal part 22A exposed to the first surface of the substrate 20 is a second land 22L. Although not illustrated, the first wiring line 21 is connected to a non-ground side terminal of an alternating current (AC) power supply. Further, the second wiring line 22 is connected to a ground side terminal of the AC power supply.

The inductor component 30 is surface-mounted on the first surface of the substrate 20 by solder 25. The inductor component 30 includes a component body 40, an inductor wiring line 50, a first external electrode 60, and a second external electrode 70.

The component body 40 of the inductor component 30 has a mounting surface 41 and a top surface 42 parallel to each other, a first end surface 43 and a second end surface 44 parallel to each other, a first side surface 47 and a second side surface 48 parallel to each other, a first inclined surface 45, and a second inclined surface 46. The component body 40 has a shape of a hexagonal prism. In a view from the axial direction of the hexagonal prism, one of the six outer surfaces corresponding to one side of the hexagon of the component body 40 is the mounting surface 41 facing the first surface of the substrate 20 when the inductor component 30 is surface-mounted on the substrate 20. In the following description, the center axis direction of the hexagonal prism-shaped component body 40 is defined as a width direction Wd. In addition, a direction perpendicular to the mounting surface 41 is defined as a height direction Td, a side on which the substrate 20 is positioned with respect to the mounting surface 41 is defined as a lower side, and the opposite side thereto is defined as an upper side. A direction perpendicular to both the width direction Wd and the height direction Td is defined as a length direction Ld. In the present embodiment, the length direction Ld corresponds to the first direction.

In the component body 40, the first inclined surface 45 is connected to a first end of the mounting surface 41 on a first side in the length direction Ld. The first inclined surface 45 is inclined toward the top surface 42 side as being separated from the first end of the mounting surface 41 in the length direction Ld. Among angles formed by the first inclined surface 45 and the mounting surface 41, an angle on the center side of the component body 40 is 135 degrees.

The first end surface 43 is connected to the upper side of the first inclined surface 45 in the height direction Td. The first end surface 43 is orthogonal to the length direction Ld. Among angles formed by the first end surface 43 and the first inclined surface 45, an angle on the center side of the component body 40 is 135 degrees.

The second inclined surface 46 is connected to a second end of the mounting surface 41 on a second side in the length direction Ld.

The second inclined surface 46 is inclined toward the top surface 42 side as being separated from the second end of the mounting surface 41 in the length direction Ld. Among angles formed by the second inclined surface 46 and the mounting surface 41, an angle on the center side of the component body 40 is 135 degrees.

The second end surface 44 is connected to the upper side of the second inclined surface 46 in the height direction Td. The second end surface 44 is orthogonal to the length direction Ld. Among angles formed by the second end surface 44 and the second inclined surface 46, an angle on the center side of the component body 40 is 135 degrees.

The top surface 42 is connected to the upper side of the first end surface 43 in the height direction Td and the upper side of the second end surface 44 in the height direction Td. The top surface 42 is orthogonal to the height direction Td. That is, the top surface 42 faces the mounting surface 41. Among angles formed by the top surface 42 and the first end surface 43, an angle on the center side of the component body 40 is 90 degrees. Among angles formed by the top surface 42 and the second end surface 44, an angle on the component body 40 side is 90 degrees.

Figure 3:
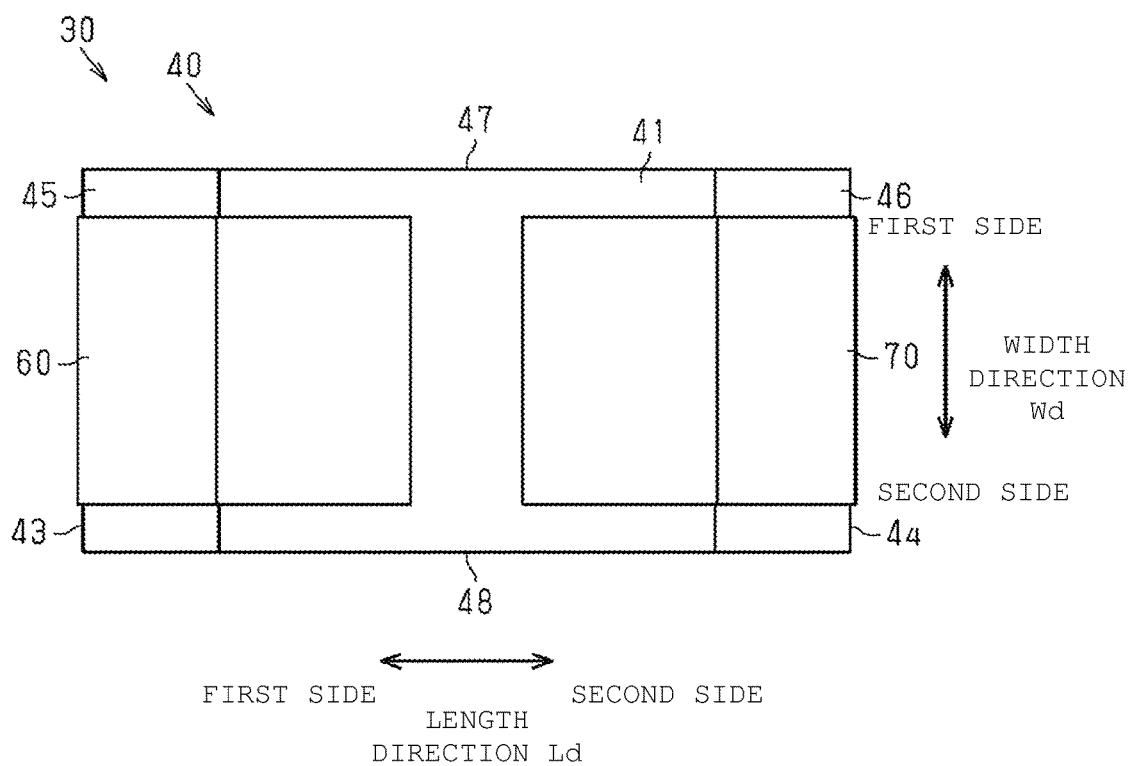
FIG. 3 is a bottom view illustrating the inductor component.

As illustrated in FIG. 3, a surface of the component body 40 on a first side in the width direction Wd is the first side surface 47 that is orthogonal to the mounting surface 41, the first inclined surface 45, the first end surface 43, the second inclined surface 46, the second end surface 44, and the top surface 42. Further, a surface of the component body 40 on a second side in the width direction Wd is the second side surface 48 that is orthogonal to the mounting surface 41, the first inclined surface 45, the first end surface 43, the second inclined surface 46, the second end surface 44, and the top surface 42.

As illustrated in FIG. 1, the component body 40 is configured by laminating a plurality of conductive layers and a plurality of insulating layers in the width direction Wd. The conductive layer is made of conductive material such as silver or copper, and constitutes the inductor wiring line 50, a first external electrode body 61 of the first external electrode 60, and a second external electrode body 71 of the second external electrode 70. The insulating layer is made of an insulator such as glass, resin, or alumina, and constitutes an element body 80. That is, the component body 40 has a structure in which the inductor wiring line 50, the first external electrode body 61, and the second external electrode body 71 are embedded in the substantially hexagonal prism-shaped element body 80.

The first external electrode body 61 of the first external electrode 60 is provided on the mounting surface 41 and the first inclined surface 45 of the component body 40. The first external electrode body 61 has a plate shape and extends from the mounting surface 41 to the first inclined surface 45. The first external electrode body 61 is embedded in the element body 80. The outer surfaces of the first external electrode body 61 are flush with the mounting surface 41 and the first inclined surface 45. Therefore, the outer surfaces of the first external electrode body 61 are exposed from the element body 80.

An end of the first external electrode body 61 on the second side in the length direction Ld is located on the first side in the length direction Ld with respect to the center of the mounting surface 41 in the length direction Ld. Therefore, the first external electrode body 61 is arranged on the first side with respect to the center of the mounting surface 41 in the length direction Ld. An end of the first external electrode body 61 on the first side in the length direction Ld reaches an end of the first inclined surface 45 on the first side in the length direction Ld. Therefore, the first external electrode body 61 is exposed at the lower end of the first end surface 43 by the thickness of the first external electrode body 61. The thickness of the first external electrode body 61 is 15 μm.

Figure 2:
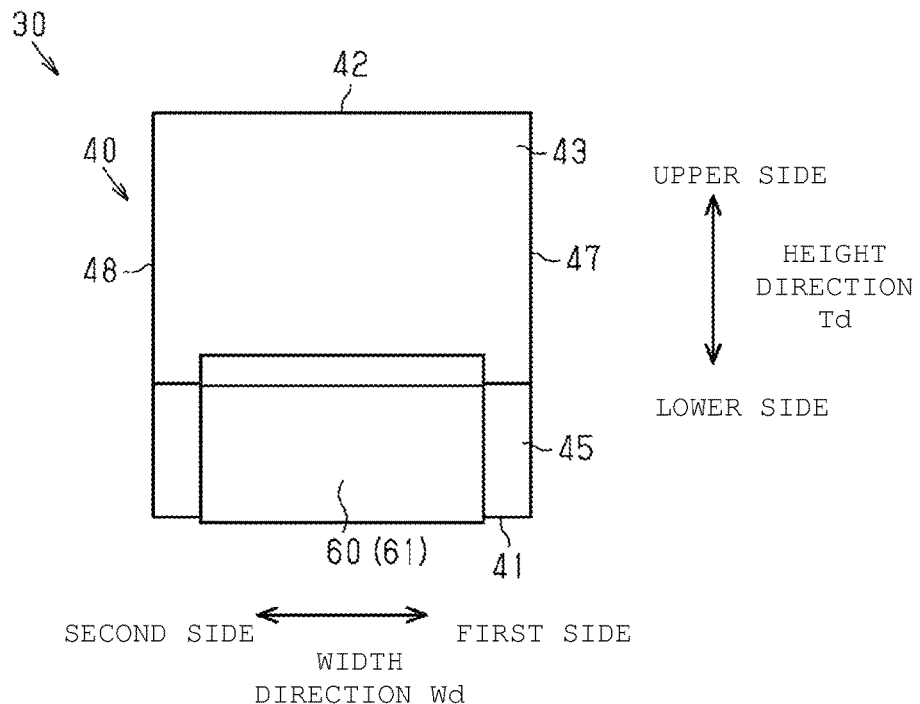
FIG. 2 is a side view illustrating an inductor component.

As shown in FIGS. 2 and 3, the dimension of the first external electrode body 61 in the width direction Wd is 0.6 times or more and 0.9 times or less (i.e., from 0.6 times to 0.9 times) the dimension of the component body 40 in the width direction Wd. In the present embodiment, the dimension of the first external electrode body 61 in the width direction Wd is 0.75 times the dimension of the component body 40 in the width direction Wd. Further, the position of the first external electrode body 61 in the width direction Wd is the center of the component body 40. Therefore, an end of the first external electrode body 61 on the first side in the width direction Wd is separated from an end of the component body 40 on the first side in the width direction Wd. Also, an end of the first external electrode body 61 on the second side in the width direction Wd is separated from an end of the component body 40 on the second side in the width direction Wd.

As shown in FIG. 1, a first plating layer 62 is laminated on surfaces exposed from the element body 80 among the outer surfaces of the first external electrode body 61. Although not illustrated, the first plating layer 62 has a two-layer structure, and a tin plating layer made of tin is laminated on a nickel plating layer made of nickel.

The second external electrode body 71 of the second external electrode 70 is provided on the mounting surface 41 and the second inclined surface 46 of the component body 40. The second external electrode body 71 has a plate shape and extends from the mounting surface 41 to the second inclined surface 46. The second external electrode body 71 is embedded in the element body 80. The outer surfaces of the second external electrode body 71 are flush with the mounting surface 41 and the second inclined surface 46. Therefore, the outer surfaces of the second external electrode body 71 are exposed from the element body 80.

An end of the second external electrode body 71 on the first side in the length direction Ld is located on the second side in the length direction Ld with respect to the center of the mounting surface 41 in the length direction Ld. Therefore, the second external electrode body 71 is arranged on the second side with respect to the center of the mounting surface 41 in the length direction Ld. An end of the second external electrode body 71 on the second side in the length direction Ld reaches an end of the second inclined surface 46 on the second side in the length direction Ld. Therefore, the second external electrode body 71 is exposed at the lower end of the second end surface 44 by the thickness of the second external electrode body 71. The thickness of the second external electrode body 71 is 15 μm.

As shown in FIG. 3, the dimension of the second external electrode body 71 in the width direction Wd is 0.6 times or more and 0.9 times or less (i.e., from 0.6 times to 0.9 times) the dimension of the component body 40 in the width direction Wd. In the present embodiment, the dimension of the second external electrode body 71 in the width direction Wd is 0.75 times the dimension of the component body 40 in the width direction Wd. Further, the position of the second external electrode body 71 in the width direction Wd is the center of the component body 40. Therefore, an end of the second external electrode body 71 on the first side in the width direction Wd is separated from an end of the component body 40 on the first side in the width direction Wd. An end of the second external electrode body 71 on the second side in the width direction Wd is separated from an end of the component body 40 on the second side in the width direction Wd.

A second plating layer 72 is laminated on surfaces exposed from the element body 80 among the outer surfaces of the second external electrode body 71. Although not illustrated, the second plating layer 72 has a two-layer structure, and a tin plating layer made of tin is laminated on a nickel plating layer made of nickel.

As illustrated in FIG. 1, in the inductor component mounting substrate 10, a distance DL from an end of the first land 21L on the first side in the length direction Ld on the first surface of the substrate 20 to an end of the second land 22L on the second side in the length direction Ld on the first surface of the substrate 20 is equal to or less than the maximum dimension of the inductor component 30 in the length direction Ld. Specifically, the distance DL coincides with a distance from the end of the first external electrode body 61 of the first external electrode 60 on the first side in the length direction Ld to the end of the second external electrode body 71 of the second external electrode 70 on the second side in the length direction Ld. That is, in the present embodiment, the distance DL coincides with the dimension of the component body 40 in the length direction Ld. In the present embodiment, the maximum dimension of the inductor component 30 in the length direction Ld is the dimension of the inductor component 30 in the length direction Ld in the section passing through the center in the width direction Wd and perpendicular to the width direction Wd. Therefore, the maximum dimension of the inductor component 30 in the length direction Ld is the dimension from the end of the first external electrode 60 on the first side in the length direction Ld to the end of the second external electrode 70 on the second side in the length direction Ld.

Although not illustrated, the dimension of the terminal part 21A in the width direction Wd is the same as the dimension of the first external electrode body 61 in the width direction Wd. Further, the dimension of the terminal part 22A in the width direction Wd is the same as the dimension of the second external electrode body 71 in the width direction Wd. Therefore, in a view from the height direction Td, the terminal part 21A is within the range of the first external electrode 60. Similarly, in the view from the height direction Td, the terminal part 22A is within the range of the second external electrode 70.

Now, a wiring structure of the inductor wiring line 50 is described in detail.

As illustrated in FIG. 1, in a view from the width direction Wd, the inductor wiring line 50 passes through a hexagonal trajectory TR which is similar to the hexagonal shape of the component body 40, with a winding center axis CA parallel to the width direction Wd as a center. That is, the inductor wiring line 50 includes a first straight portion 51 to a sixth straight portion 56 each corresponding to each side of the trajectory TR in the view from the width direction Wd. In the present embodiment, the inductor wiring line 50 is configured by laminating a plurality of conductive layers including a part of the straight portion in the same layer. The plurality of conductive layers are connected by vias (not illustrated).

The first straight portion 51 of the inductor wiring line 50 extends parallel to the mounting surface 41 in the view from the width direction Wd, and is located below the center of the component body 40 in the height direction Td.

A second straight portion 52 is connected to an end of the first straight portion 51 on the first side in the length direction Ld.

The second straight portion 52 extends in parallel to the first inclined surface 45 in the view from the width direction Wd. The second straight portion 52 extends farther to the first side in the length direction Ld than the end of the mounting surface 41 on the first side end in the length direction Ld. Among angles formed by the second straight portion 52 and the first straight portion 51, an angle on the winding center axis CA side is 135 degrees.

A third straight portion 53 is connected to an end of the second straight portion 52 on the first side in the length direction Ld.

The third straight portion 53 is arranged farther on the first side in the length direction Ld than the end of the mounting surface 41 on the first side in the length direction Ld. The third straight portion 53 extends in parallel to the first end surface 43 in the view from the width direction Wd. Among angles formed by the third straight portion 53 and the second straight portion 52, an angle on the winding center axis CA side is 135 degrees.

A fourth straight portion 54 is connected to an upper end of the third straight portion 53 in the height direction Td. The fourth straight portion 54 extends in parallel to the top surface 42 in the view from the width direction Wd. An end of the fourth straight portion 54 on the first side in the length direction Ld is arranged farther on the first side in the length direction Ld than the end of the mounting surface 41 on the first side in the length direction Ld. An end of the fourth straight portion 54 on the second side in the length direction Ld is arranged farther on the second side in the length direction Ld than the end of the mounting surface 41 on the second side in the length direction Ld. Among angles formed by the fourth straight portion 54 and the third straight portion 53, an angle on the winding center axis CA side is 90 degrees.

A fifth straight portion 55 is connected to an end of the fourth straight portion 54 on the second side in the length direction Ld.

The fifth straight portion 55 extends in parallel to the second end surface 44 in the view from the width direction Wd. The fifth straight portion 55 extends farther to the second side in the length direction Ld than the end of the mounting surface 41 on the second side in the length direction Ld. Among angles formed by the fifth straight portion 55 and the fourth straight portion 54, an angle on the winding center axis CA side is 90 degrees.

The sixth straight portion 56 is connected to a lower end of the fifth straight portion 55 in the height direction Td. The sixth straight portion 56 extends in parallel to the second inclined surface 46 in the view from the width direction Wd. Many portions of the sixth straight portion 56 on the second side in the length direction Ld are located farther on the second side in the length direction Ld than the end of the mounting surface 41 on the second side in the length direction Ld. An angle formed by the sixth straight portion 56 and the fifth straight portion 55 is 135 degrees. Among the angles formed by the sixth straight portion 56 and the first straight portion 51, an angle on the winding center axis CA side is 135 degrees. In the section illustrated in FIG. 1, the sixth straight portion 56 is arranged in a layer different from other straight portions.

By repeatedly winding the first straight portion 51 to the sixth straight portion 56 in this manner, the inductor wiring line 50 as a whole has a spiral shape advancing in the extending direction of the winding center axis CA which is the center axis of winding. The winding center axis CA of the inductor wiring line 50 extends in a direction perpendicular to the first side surface 47, that is, in the width direction Wd. The winding center axis CA is located at the center of the component body 40 in the view from the width direction Wd.

Among the distances in the length direction Ld between inner edges, which are edges of the inductor wiring line 50 on the winding center axis CA side, the distance between the inner edge of the third straight portion 53 and the inner edge of the fifth straight portion 55 is the largest. The distance between the inner edge of the third straight portion 53 and the inner edge of the fifth straight portion 55 is larger than the dimension of the mounting surface 41 in the length direction Ld. That is, in the present embodiment, the inner diameter of the inductor wiring line 50 in the length direction Ld is larger than the dimension of the mounting surface 41 in the length direction Ld. Therefore, the inductor wiring line 50 is wound over a range in the length direction Ld from the upper side of the first inclined surface 45 to the upper side of the second inclined surface 46 through the upper side of the mounting surface 41.

Next, the action of the above embodiment is described.

In the inductor component mounting substrate 10, when the voltage is applied from the first wiring line 21 of the substrate 20 to the inductor component 30, the current flows through the inductor wiring line 50. When the current flows through the inductor wiring line 50, the direction of the magnetic flux substantially coincides with the width direction Wd at the same position as the inductor wiring line 50 in the width direction Wd.

Next, the effects of the above embodiment are described. Note that the following effects common to the first external electrode 60 and the second external electrode 70 are described with the first external electrode 60 as a representative.

(1) It is assumed that the winding center axis CA of the inductor wiring line 50 is orthogonal to the mounting surface 41. In this case, the direction of the magnetic flux generated in the inductor component 30 is also the direction along the height direction Td. Therefore, as illustrated in FIG. 3, in the view from the height direction Td, the larger the proportion occupied by the first external electrode 60, the more easily the magnetic flux generated in the inductor component 30 is blocked by the first external electrode 60. The area of the first external electrode 60 exposed from the element body 80 is required to be correspondingly large in order to mount the inductor component 30 on the substrate 20 by the solder 25. Therefore, in the case of the winding center axis CA of the inductor wiring line 50 being orthogonal to the mounting surface 41, the magnetic flux generated in the inductor component 30 is easily blocked by the first external electrode 60.

On the other hand, according to the above embodiment, the winding center axis CA of the inductor wiring line 50 extends in a direction perpendicular to the first side surface 47. Therefore, as described above, the direction of the magnetic flux generated in the inductor component 30 is also perpendicular to the first side surface 47. In the above embodiment, because the first external electrode 60 does not extend along the first side surface 47 or the second side surface 48, the magnetic flux can be suppressed from being blocked by the first external electrode 60. Therefore, regardless of the inner diameter of the inductor wiring line 50 being increased so as to reach the upper side of the first inclined surface 45 or the upper side of the second inclined surface 46, due to the above, the magnetic flux is not easily blocked by the first external electrode 60.

(2) According to the above embodiment, the first external electrode 60 extends from the mounting surface 41 to the first inclined surface 45. Therefore, the surface area of the first external electrode 60 on the mounting surface 41 side is correspondingly increased. Therefore, the inductor component 30 can be firmly fixed to the substrate 20.

(3) According to the above embodiment, the first external electrode 60 extends over the entire length direction Ld of the first inclined surface 45. Therefore, the first external electrode 60 can be mounted on the substrate 20 by the solder 25 in the entire range in the length direction Ld of the first inclined surface 45. Therefore, the inductor component 30 is easily fixed to the substrate 20 firmly.

Regardless of the first external electrode 60 extending over the entire first inclined surface 45 as described above, the proportion of the first external electrode 60 in the component body 40 in the view from the width direction Wd does not become so large. Therefore, the first external electrode 60 can be prevented from blocking the magnetic flux along the width direction while the area where the first external electrode 60 faces the substrate 20 is secured.

(4) According to the above embodiment, the component body 40 has the hexagonal shape in the view from the width direction Wd. Among the six side surfaces, the angles formed by two adjacent side surfaces are all 90 degrees or more. Therefore, the component body 40 is less likely to be chipped at a corner, which is a boundary portion between the surfaces, than in a case of the corner of the component body 40 being an acute angle.

Figure 4:
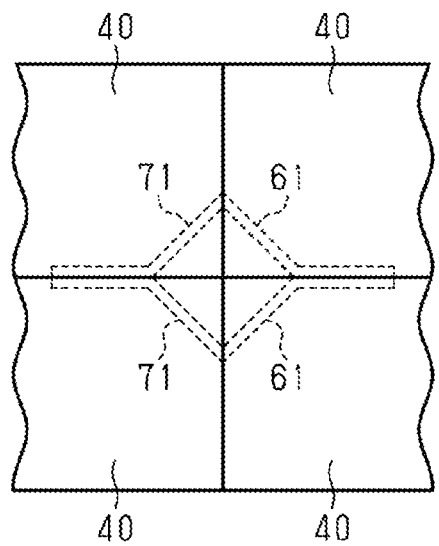
FIG. 4 is an explanatory view for explaining a process of manufacturing the inductor component.

Here, in manufacturing the component body 40, as illustrated in FIG. 4, a substrate including the plurality of component bodies 40 is cut straight with a dicing machine to be singulated. In this case, in the substrate before singulation, the plurality of component bodies 40 can be arranged such that the first external electrode bodies 61 or the second external electrode bodies 71 of the four component bodies 40 form a rhombus surrounded by the four external electrode bodies with the exposed surface as the inner side. Therefore, a large number of component bodies 40 can be arranged on the substrate, and a portion that does not become the component body 40 can be suppressed to only the rhombic portion.

(5) According to the above embodiment, the inductor wiring line 50 includes the first straight portion 51 to the sixth straight portion 56 that are arranged so as to pass through the hexagonal trajectory TR. The first straight portion 51 extends in parallel to the mounting surface 41 in the view from the width direction Wd. Therefore, the first straight portion 51 can be arranged at a position close to the mounting surface 41. Similarly, the second straight portion 52 to the sixth straight portion 56 can also be arranged at positions close to the respective outer surfaces in the view from the width direction Wd. As a result, the inner diameter of the inductor wiring line 50 can be increased accordingly.

(6) According to the above embodiment, among the angles formed by the extending direction of the first straight portion 51 and the extending direction of the second straight portion 52, the angle on the center side of the component body 40, that is, the winding center axis CA side of the inductor wiring line 50 is 135 degrees. Among angles formed by the extending direction of the second straight portion 52 and the extending direction of the third straight portion 53, the angle on the component body 40 side, that is, the winding center axis CA side of the inductor wiring line 50 is 135 degrees. Therefore, it is possible to avoid sudden bending when the inductor wiring line 50 extends from the mounting surface 41 to the first end surface 43 through the first inclined surface 45. Therefore, the loss of the current flowing through the inductor wiring line 50 can be suppressed.

(7) According to the above embodiment, the thickness of the first external electrode body 61, that is, the distance from the upper end of the first external electrode 60 in the height direction Td to the mounting surface 41 is 15 Therefore, the distance from the upper end of the first external electrode 60 in the height direction Td to the mounting surface 41 is 10 μm or more. Therefore, as shown in FIG. 4, when cutting with a dicing machine is performed in the length direction Ld, regardless of positional accuracy in dicing being low, the first external electrode body 61 is not easily lost from the component body 40.

(8) According to the above embodiment, the dimension of the first external electrode body 61 in the width direction Wd is 0.6 times or more and 0.9 times or less (i.e., from 0.6 times to 0.9 times) the dimension of the component body 40 in the width direction Wd. Therefore, in the first external electrode 60, the first plating layer 62 can be suppressed from excessively growing from the surface of the first external electrode body 61 and reaching the first side surface 47 and the second side surface 48.

(9) According to the above embodiment, in the view from the height direction Td, the terminal part 21A is within the range of the first external electrode 60. Similarly, in the view from the height direction Td, the terminal part 22A is within the range of the second external electrode 70. Therefore, in the inductor component mounting substrate 10, the space on the substrate 20 can be more effectively utilized in mounting the inductor component 30 on the substrate 20.

(10) According to the above embodiment, the solder 25 can be arranged in the space below the first inclined surface 45. Therefore, when the inductor component 30 is viewed from the height direction Td, the solder 25 hardly protrudes to the outside of the inductor component 30. As a result, in a state in which the inductor component 30 is mounted on the substrate 20, the inductor component 30 does not need to be excessively spaced apart from other components.

The above embodiment can be modified as follows. The above embodiment and the following modifications can be implemented in combination within a range not technically contradictory.

In the substrate 20 of the inductor component mounting substrate 10, the arrangement relationship between the terminal part 21A of the first wiring line 21 and the terminal part 22A of the second wiring line 22 is not limited to the example of the above embodiment. For example, the distance DL from the end of the first wiring line 21 on the first side in the length direction Ld on the first surface of the substrate 20 to the end of the second wiring line 22 on the second side in the length direction Ld on the first surface of the substrate 20 may be larger than the dimension of the inductor component 30 in the length direction Ld.

The shape of the component body 40 is not limited to the example of the above embodiment as long as the component body has the mounting surface 41, the first inclined surface 45, and the second inclined surface 46. For example, in the view from the width direction Wd, the component body 40 may have a trapezoidal shape in which the mounting surface 41 is smaller than the top surface 42. In this case, the upper end of the first inclined surface 45 and the upper end of the second inclined surface 46 are connected by the top surface 42.

The shape of the component body 40 may not be symmetrical between the first side and the second side in the width direction Wd while being symmetrical about the center in the width direction Wd. For example, the angle of the first inclined surface 45 with respect to the mounting surface 41 may be different from the angle of the second inclined surface 46 with respect to the mounting surface 41.

In the inductor wiring line 50, the angle formed by the two adjacent straight portions is not limited to the example of the above embodiment. For example, there is a case in which the angle formed by the first straight portion 51 and the second straight portion 52 and the angle formed by the second straight portion 52 and the third straight portion 53 are shifted from each other by about 10 degrees due to a manufacturing error or the like. Therefore, as long as the angle formed by the first straight portion 51 and the second straight portion 52 and the angle formed by the second straight portion 52 and the third straight portion 53 are 125 degrees or more and 145 degrees or less (i.e., from 125 degrees to 145 degrees), the current flowing through the inductor wiring line 50 can be suppressed from sharply changing in direction as in the above embodiment. Further, the angle formed by first straight portion 51 and second straight portion 52 may be smaller than 125 degrees or larger than 145 degrees. Similarly, the angle formed by second straight portion 52 and third straight portion 53 may be smaller than 125 degrees or larger than 145 degrees.

In the inductor wiring line 50, the straight portions may be connected with a curved portion interposed therebetween at a connection portion between the straight portions. In this case, the connection portion between the straight portions may be smooth without forming a corner as in the above embodiment.

The configuration of the inductor wiring line 50 is not limited to the example of the above embodiment. For example, in the view from the width direction Wd, the inductor wiring line 50 may pass through a circular or elliptical trajectory. In addition, the inductor wiring line 50 may have a shape including both a straight portion and a curved portion.

The inductor wiring line 50 may have any shape as long as the inductor wiring line 50 has a spiral shape advancing in the extending direction of the winding center axis CA. The spiral shape of the inductor wiring line 50 advancing in the extending direction of the winding center axis CA is not limited to the helical structure in which the number of turns is less than one around the winding center axis CA in each layer, but may be a spiral structure in which the number of turns is one or more around the winding center axis CA in each layer.

The dimension of the first external electrode body 61 in the width direction Wd may be smaller than 0.6 times or larger than 0.9 times the dimension of the component body 40 in the width direction Wd. If each dimension of the component body 40 is correspondingly large, the inductor component 30 can be firmly fixed to the substrate 20 regardless of the dimension of the first external electrode body 61 in the width direction Wd being correspondingly small compared to the dimension of the component body 40 in the width direction Wd. Regardless of each dimension of the component body 40 being correspondingly small, if the dimension of the first external electrode body 61 in the width direction Wd is correspondingly larger than the dimension of the first external electrode body 61 in the width direction Wd, the inductor component 30 can be suppressed from not being easy to be fixed to the substrate 20. The same applies to the dimension of the second external electrode body 71 in the width direction Wd.

The thickness of the first external electrode body 61 is not limited to the example of the above embodiment. The thickness of the first external electrode body 61 may be thinner than 10 µm. In this case, an amount of the element body 80 can be increased in the case of using the inductor component 30 having the same volume. The same applies to the thickness of the second external electrode body 71.

The exposed portion of the first external electrode 60 is not limited to the example of the above embodiment. For example, the first end of the first external electrode 60 in the length direction Ld may be located in the middle of the first inclined surface 45. For example, the first external electrode 60 may be exposed only on the mounting surface 41. Further, for example, the first external electrode 60 may be exposed in a range from the mounting surface 41 to the first end surface 43 through the first inclined surface 45. The same applies to the exposed portion of the second external electrode 70.

The configuration of the first external electrode 60 is not limited to the example of the above embodiment. The configuration of the first plating layer 62 may be appropriately changed. For example, the first plating layer 62 may have a single-layer structure or a structure in which three or more layers are laminated. Furthermore, the first plating layer 62 may be omitted. In this case, the first external electrode 60 is constituted only of the first external electrode body 61.

Figure 5:
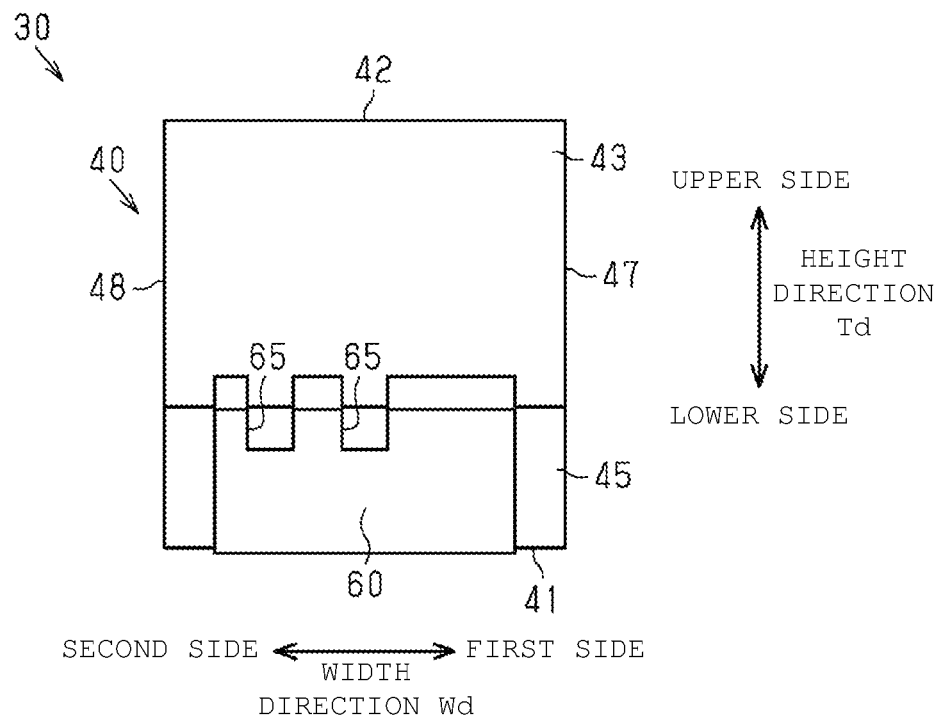
FIG. 5 is a side view illustrating an inductor component according to a modification.

For example, as illustrated in FIG. 5, an upper edge of the first external electrode 60 in the height direction Td may have a non-linear shape. The upper edge of the first external electrode 60 in the height direction Td may be provided with notches 65 that are recessed downward in the height direction Td along the first inclined surface 45. In this case, the recessed surfaces of the recesses of the first external electrode 60 can also be in contact with the component body 40. Therefore, the first external electrode 60 is firmly attached to the component body 40.

What is claimed is:

1. An inductor component comprising:
   a component body having a mounting surface and a top surface facing the mounting surface;
   an inductor wiring line having a spiral shape, provided in the component body, and advancing in an extending direction of a winding center axis;
   a first external electrode connected to a first end of the inductor wiring line and exposed to the mounting surface; and
   a second external electrode connected to a second end of the inductor wiring line and exposed to the mounting surface,
   the first external electrode being arranged on a first side in a first direction parallel to the mounting surface, and
   the second external electrode being arranged on a second side opposite to the first side with respect to the first external electrode in the first direction,
   the component body including:
   a first inclined surface connected to a first end of the mounting surface on the first side in the first direction and inclined toward the top surface as being away from the first end; and
   the winding center axis of the inductor wiring line extending in a direction parallel to the mounting surface and perpendicular to the first direction.

2. The inductor component according to claim 1, wherein the mounting surface and the first inclined surface are a continuous surface.

3. The inductor component according to claim 1, wherein the first external electrode extends from the mounting surface to a first end surface of the component body.

4. The inductor component according to claim 1, wherein the inductor wiring line includes, in a view from the extending direction of the winding center axis, a curved portion.

5. The inductor component according to claim 1, wherein the inductor wiring line includes, in a view from the extending direction of the winding center axis, both a straight portion and a curved portion.

6. The inductor component according to claim 1, further comprising:
   a first land to which the first external electrode is connected by solder,
   wherein in a view from the extending direction of the winding center axis, the solder has a larger inclination on a center side of the component body than on the first side in a first direction.
7. The inductor component according to claim 1, wherein the component body has a plurality of angles from the mounting surface to a first end surface of the component body.

\* \* \* \* \*